United States Patent [19]

Herre

[11] Patent Number: 5,781,888

[45] Date of Patent: Jul. 14, 1998

[54] PERCEPTUAL NOISE SHAPING IN THE TIME DOMAIN VIA LPC PREDICTION IN THE FREQUENCY DOMAIN

[75] Inventor: Juergen Heinrich Herre, Basking Ridge, N.J.

[73] Assignee: Lucent Technologies Inc., Murray Hill, N.J.

[21] Appl. No.: 585,086

[22] Filed: Jan. 16, 1996

[51] Int. Cl.$^6$ .............................. G10L 3/02; G10L 9/00
[52] U.S. Cl. ........................................ 704/219; 704/205
[58] Field of Search ........................... 395/2.14, 2.18, 395/2.2, 2.21, 2.28, 2.29, 2.38, 2.39; 375/242, 244, 350, 241

[56] References Cited

U.S. PATENT DOCUMENTS

| | | | |
|---|---|---|---|
| 4,837,617 | 6/1989 | Brusewitz | 348/409 |
| 4,875,095 | 10/1989 | Matsumoto et al. | 348/409 |
| 4,943,855 | 7/1990 | Bheda et al. | 358/133 |
| 5,285,498 | 2/1994 | Johnston | 381/2 |
| 5,341,457 | 8/1994 | Hall, II et al. | 395/2.35 |
| 5,511,093 | 4/1996 | Edler et al. | 375/240 |

OTHER PUBLICATIONS

Singhal S., "High Quality Audio Coding Using Multipulse LPC" ICASSP '90, pp. 1101–1104.

Badra et al., "ADPCM Compression Of Speech Signals Using A Frequency Domain LMS Algorithm" Devices, Circuits and Systems, 1995 Int'l. Caracas Conference, pp. 313–317.

Mahieux et al., "Transform Coding Of Audio Signals Using Correlation Between Successive Transform Blocks" ICASSP '89 :Acoustics , Speech & Signal Processing Conferenc. pp. 2021–2024.

Boland et al., "High Audio Coding Using Multipulse LPC and Wavelet Decomposition" ICASSP 95: Acoustics, Speech & Signal Processing Conference, vol. 5, pp. 3067–3069.

K. Brandenburg, G. Stoll et al.: "The ISO/MPEG–Audio Codec: Generic Standard For Coding of High Quality Digital Audio", 92nd AES Convention, Vienna, 1992, pp. 1–22.

M. Link, "An Attack Processing Of Audio Signals For Optimizing The Temporal Characteristics Of A Low Bit–Rate Audio Coding System," The 95th Convention AES, New York, Oct. 1993, pp. 1–11.

R. Rinaldo, G. Calvagno, "Image Coding By Block Prediction Of Multiresolution Subimages", IEEE Transactions On Image Processing, vol. 4, No. 7, Jul. 1995, pp. 909–920.

H. Krupnik, D. Malah and E. Karnin, "Fractal Representation Of Images Via The Discrete Wavelet Transform", Proc. IEEE National Convention of EE in Israel, Tel–Aviv, Mar. 95, pp. 1–5.

N.S. Jayant, P. Noll, "Digital Coding Of Waveforms", Chapters 6.1 and 7.1–7.2, Englewood Cliffs, NJ, Prentice Hall, 1984, pp. 252–363.

ISO/IEC JTC1/SC29/WG11 MPEG, International Standard ISO 11172–3 "Coding Of Moving Pictures And Associated Audio For Digital Storage Media At Up To About 1.5 Mbit/s", Annex C.1.5.3, pp. 80–108.

*Primary Examiner*—David R. Hudspeth
*Assistant Examiner*—Patrick N. Edouard
*Attorney, Agent, or Firm*—Kenneth M. Brown

[57] ABSTRACT

A method and apparatus for the perceptual coding of audio signals in which perceptual noise shaping is achieved in the time domain by performing a (linear) prediction (i.e., filtering) in the frequency domain. As a result, the temporal spread of quantization noise is reduced. Specifically, according to one illustrative embodiment of the present invention, a method comprises decomposition of the audio signal into a plurality of spectral component signals; generating a prediction signal representative of a prediction of one of said spectral component signals, said prediction based on one or more other ones of said spectral component signals; comparing the prediction signal with said one of said spectral component signals to generate a prediction error signal; coding said one of said spectral component signals based on the prediction error signal to generate a coded spectral component signal; and generating the encoded signal based on the coded spectral component signal.

24 Claims, 5 Drawing Sheets

PERCEPTUAL NOISE SHAPING IN THE TIME DOMAIN VIA LPC PREDICTION IN THE FREQUENCY DOMAIN

FIELD OF THE INVENTION

The present invention relates to the field of audio signal coding and more specifically to an improved method and apparatus for coding audio signals based on a perceptual model.

BACKGROUND OF THE INVENTION

During the last several years so-called "perceptual audio coders" have been developed enabling the transmission and storage of high quality audio signals at bit rates of about $\frac{1}{12}$ or less of the bit rate commonly used on a conventional Compact Disc medium (CD). Such coders exploit the irrelevancy contained in an audio signal due to the limitations of the human auditory system by coding the signal with only so much accuracy as is necessary to result in a perceptually indistinguishable reconstructed (i.e., decoded) signal. Standards have been established under various standards organizations such as the International Standardization Organization's Moving Picture Experts Group (ISO/MPEG) MPEG1 and MPEG2 audio standards. Perceptual audio coders are described in detail, for example, in U.S. Pat. No. 5,285,498 issued to James D. Johnston on Feb. 8, 1994 and in U.S. Pat. No. 5,341,457 issued to Joseph L. Hall II and James D. Johnston on Aug. 23, 1994, each of which is assigned to the assignee of the present invention. Each of U.S. Pat. Nos. 5,285,498 and 5,341,457 is hereby incorporated by reference as if fully set forth herein.

Generally, the structure of a perceptual audio coder for monophonic audio signals can be described as follows:

The input samples are converted into a subsampled spectral representation using various types of filterbanks and transforms such as, for example, the well-known modified discrete cosine transform (MDCT), polyphase filterbanks or hybrid structures.

Using a perceptual model one or more time-dependent masking thresholds for the signal are estimated. These thresholds give the maximum coding error that can be introduced into the audio signal while still maintaining perceptually unimpaired signal quality.

The spectral values are quantized and coded according to the precision corresponding to the masking threshold estimates. In this way, the quantization noise may be hidden (i.e., masked) by the respective transmitted signal and is thereby not perceptible after decoding.

Finally, all relevant information (e.g., coded spectral values and additional side information) is packed into a bitstream and transmitted to the decoder.

Accordingly, the processing used in a corresponding decoder is reversed:

The bitstream is decoded and parsed into coded spectral data and side information.

The inverse quantization of the quantized spectral values is performed.

The spectral values are mapped back into a time domain representation using a synthesis filterbank.

Using such a generic coder structure it is possible to efficiently exploit the irrelevancy contained in each signal due to the limitations of the human auditory system. Specifically, the spectrum of the quantization noise can be shaped according to the shape of the signal's noise masking threshold. In this way, the noise which results from the coding process can be "hidden" under the coded signal and, thus, perceptually transparent quality can be achieved at high compression rates.

Without further precautions, however, a perceptual coder may not deliver transparent signal quality when coding transient signals such as, for example, castanet or glockenspiel sounds. This problem results from what is commonly known as the "pre-echo" problem, familiar to those skilled in the art. In particular, while the signal to be coded may contain strong signal components in only portions of the time window processed by the coder's analysis filterbank and a given instant, the resultant coding error typically becomes spread out across the entire window length. Thus, the quantization noise may be distributed over a period of, for example, 20 milliseconds or more, and it may thereby exceed the magnitude of original signal components in certain signal regions. Given, for example, a castanet signal with an "attack" in the middle portion of an analysis window, the noise components of the coded signal may be stronger than the original signal components in the portion of the window immediately before the "attack."

It is known that, due to the properties of the human auditory system, such "pre-echoes" are masked only if no significant amount of the coding noise is present longer than approximately 2 ms before the onset of the signal. Otherwise the coding noise is likely to be perceived as a "pre-echo" artifact—i.e., a short noise-like event preceding the signal onset.

A number of techniques have been proposed in order to avoid pre-echo artifacts in an encoded/decoded signal produced by a perceptual audio coding system:

1) One technique which has been used is to increase the coding precision of the spectral coefficients of the filterbank window that first covers the transient signal portion. This is known as "pre-echo control," and is incorporated, for example, in the MPEG1 audio standard. Since this approach requires considerably more bits for the coding of these frames, such a method cannot be easily applied in a constant bit rate coder. To a certain degree, local variations in bit rate demand can be accounted for by using the conventional technique known as a "bit reservoir," also incorporated, for example, in the MPEG1 audio standard. This technique permits the handling of peak demands in bit rate by using bits that have been set aside during the coding of earlier frames—thus, the average bit rate still remains constant. In practice, however, the size of the bit reservoir needs to be unrealistically large in order to avoid artifacts when coding input signals of a very transient nature.

2) A different strategy used in many conventional perceptual audio coders is known as adaptive window switching. This technique, also incorporated in the MPEG1 audio standard, adapts the size of the filterbank windows to the characteristics of the input signal. While portions of the signal which are relatively stationary will use a long window length (as is usual), short windows are used to code the transient portions of the signal. In this way, the peak bit demand can be reduced considerably because the regions for which a high coding precision is required are constrained in time.

One major disadvantage of the adaptive window switching technique is that it introduces significant additional complexity into the coder and complicates its structure. Since the different window sizes require different parameters and encoding strategies, a coder using window switching in fact consists of essentially two coders, one for the longer window size and one for the shorter window size. Moreover, this technique cannot be used efficiently in the case of a "pitched" signal consisting of a pseudo-stationary series of impulse-like signals, such as, for example, human speech, without incurring a substantial penalty in coding efficiency. Due to the mechanism of speech production, the temporal spread of quantization noise would only be adequately avoided with use of this technique by permanently selecting the shorter window size. This would, in turn, lead to a significant decrease in coder efficiency due to the decreased coding gain and increased side information overhead.

3) A third technique which has been used to avoid the temporal spread of quantization noise is to apply a gain change/modification to the signal prior to performing the spectral decomposition. The underlying principle of this approach is to reduce the dynamics of the input signal by applying a gain modification prior to its encoding. The parameters of the gain modification are then transmitted in the bitstream—using this information the process may be reversed on the decoder side.

In order to perform well for most signals, however, the processing has to be applied to different parts of the frequency spectrum independently, since transient events are often present only in certain portions of the spectrum. This can be done using more complex hybrid filterbanks that allow for separate gain processing of different spectral components. In general, however, the interdependencies between the gain modification and the coder's perceptual model are often difficult to resolve.

SUMMARY OF THE INVENTION

In accordance with an illustrative embodiment of the present invention, a method and apparatus which overcomes the drawbacks of prior art techniques is provided. In particular, perceptual noise shaping is achieved in the time domain by performing a (linear) prediction (i.e., filtering) in the frequency domain. As a result, the temporal spread of quantization noise is reduced. Specifically, according to one illustrative embodiment of the present invention, the following processing steps are applied in an encoder for use with monophonic signals:

The audio signal to be coded is decomposed into spectral coefficients by a high-resolution filterbank/transform (such as that used for the "longer block" in conventional perceptual coders which employ adaptive window switching).

Using a perceptual model, one or more time-dependent masking thresholds for the signal are estimated. These thresholds give the maximum coding error that can be introduced into the audio signal while still maintaining perceptually unimpaired signal quality.

The encoding of the spectral values is then performed using a quantization/coding scheme based on Differential Pulse Code Modulation (DPCM) that operates on the filterbank outputs in frequency. As in conventional perceptual coders, the target for the required coding precision may be given by the perceptual model.

Finally, all relevant information (e.g., the coded spectral values and the generated side information) is packed into a bitstream and transmitted to the decoder. In particular, the generated side information includes a flag indicating the use of DPCM coding and, if used, information about the target frequency range and the filter employed for encoding.

Similarly, a corresponding illustrative decoder in accordance with an illustrative embodiment of the present invention performs the following processing steps:

The bitstream is decoded and parsed into coded spectral data and side information.

The inverse quantization of the quantized spectral values is performed. In particular, this may include the DPCM decoding of spectral values if the use of DPCM has been flagged in the side information.

The spectral values are mapped back into a time domain representation using a synthesis filterbank.

The selection of the type of DPCM quantization/coding scheme (predictor/quantizer combination) may yield different advantages for the overall system behavior. Specifically, and in accordance with a first illustrative embodiment of the present invention, a closed-loop DPCM system is employed. Although this first embodiment results in a coding gain for transient signals, in a preferred approach in accordance with a second embodiment of the present invention, an open-loop DPCM system is employed. This second embodiment will advantageously result in a time-shaped quantization error at the output of the decoder. Specific processing is applied to spectral coefficients, the quantization noise in the decoded signal (after the inverse filterbank is applied in the decoder) will be shaped in time, thereby keeping the quantization noise under the actual signal. In this manner, temporal problems with unmasking, either in transient or pitchy signals, are advantageously avoided without the need for substantial overcoding and its commensurate expenditure of bits.

DETAILED DESCRIPTION

The instant inventive method and apparatus overcomes the drawbacks of prior art techniques by effectively replacing the use of a conventional Pulse Code Modulation (PCM) quantization/coding scheme as is typically used in conventional perceptual audio coders with a quantization/coding scheme based on Differential Pulse Code Modulation (DPCM), wherein the DPCM scheme operates on the filterbank outputs in the frequency domain. (Both PCM coding and DPCM coding techniques in general are well known to those skilled in the art.)

Figure 1:
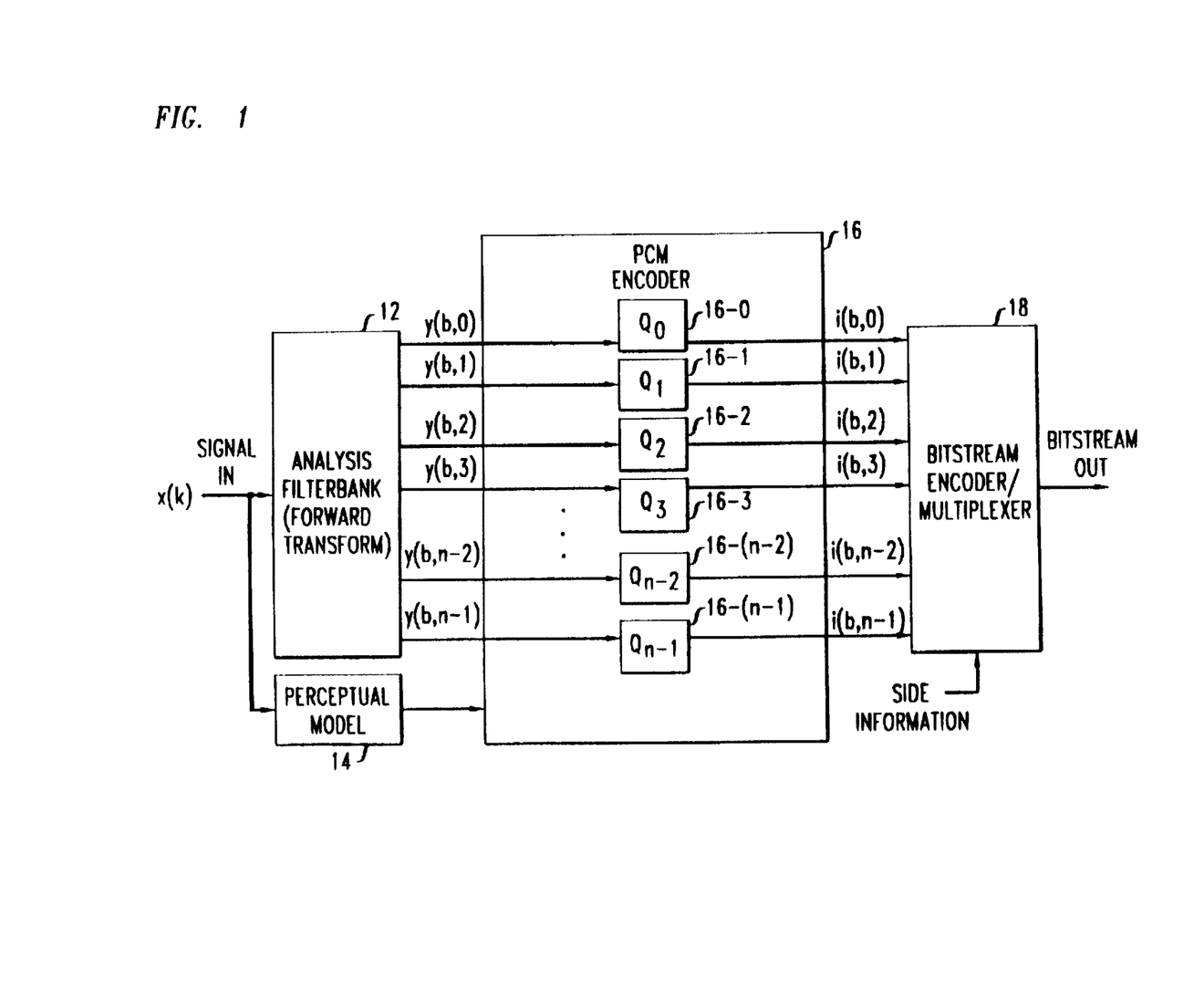
FIG. 1 shows a conventional apparatus for performing perceptual audio encoding employing a PCM quantization/coding scheme for use in coding monophonic audio signals.

FIG. 1 shows a conventional perceptual encoder for use in coding monophonic audio signals. The encoder of FIG. 1 performs the following steps:

The input signal x(k) is decomposed into spectral coefficients by analysis filterbank/transform 12, resulting in "n" spectral components y(b,0) ... y(b,n−1) for each analysis block "b," where "n" is the number of spectral coefficients per analysis block (i.e., the block size). Each spectral component y(b,j) is associated with an analysis frequency or frequency range according to the employed filterbank.

Perceptual model estimates the required coding precision for a perceptually transparent quality of the encoded/decoded signal and generates one or more masking thresholds. This information may, for example, comprise the minimum signal-to-noise ratio (SNR) required in each frequency band, and is provided to PCM encoder 16.

Each spectral component y(b,j) is quantized and mapped to transmission indices i(b,0) ... i(b,n−1) by quantizers 16-0 ... 16-(n−1), respectively (performing quantizations $Q_0 \ldots Q_{n-1}$, respectively). These quantizers perform a PCM quantization/coding of the spectral coefficients in accordance with the perceptual masking thresholds generated by perceptual model 14.

The index values i(b,0) ... i(b,n−1) are passed to bitstream encoder 18 together with (optional) side information, and are subsequently transmitted (e.g., to a decoder) in the encoded bitstream. Alternatively, the encoded bitstream may be stored on an audio signal storage medium such as a Compact Disc (CD) or a Digital Audio Tape (DAT) for later retrieval.

Figure 3:
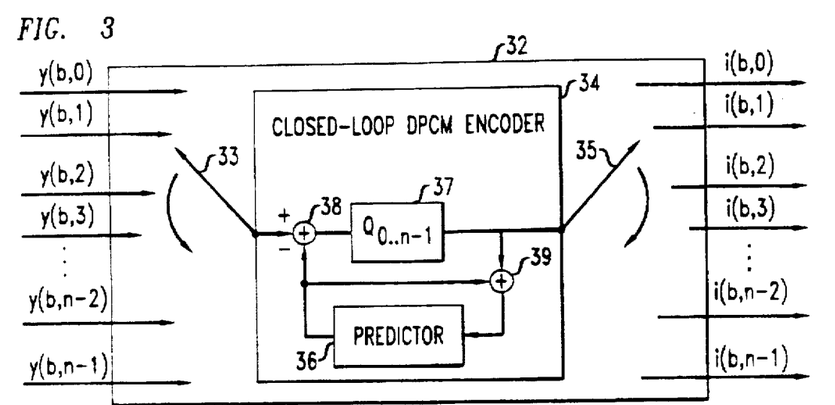
FIG. 3 shows a perceptual audio encoder employing a closed-loop prediction scheme in accordance with a first illustrative embodiment of the present invention.
Figure 4:
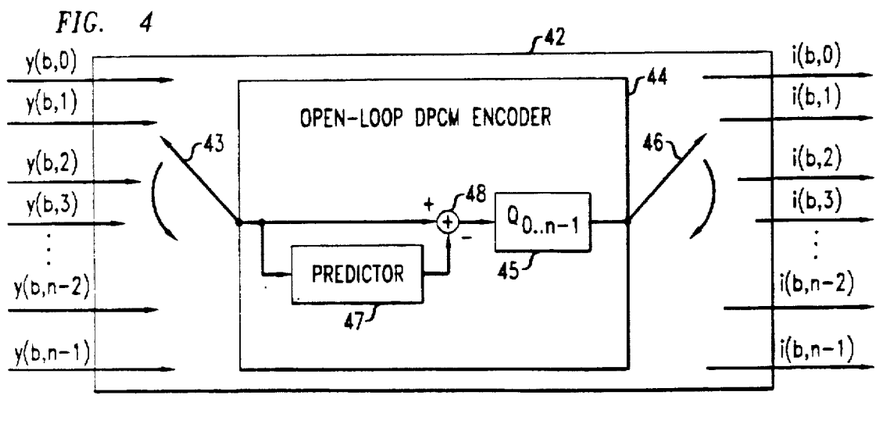
FIG. 4 shows a perceptual audio encoder employing an open-loop prediction scheme in accordance with a second illustrative embodiment of the present invention.

In accordance with certain illustrative embodiments of the present invention, the encoding apparatus of FIG. 1 may be advantageously modified by replacing PCM encoder 16 with a DPCM-type encoder wherein the DPCM encoding is performed in the frequency domain. FIGS. 3 and 4 show two such illustrative embodiments of the present invention. In particular, an illustrative embodiment of the present invention may be realized by replacing PCM encoder 16 of the conventional encoding apparatus of FIG. 1 with module 32 as shown in FIG. 3, thereby resulting in an encoding apparatus in accordance with a first illustrative embodiment of the present invention. Similarly, another illustrative embodiment of the present invention may be realized by replacing PCM encoder 16 of the conventional encoding apparatus of FIG. 1 with module 42 as shown in FIG. 4, thereby resulting in an encoding apparatus in accordance with a second illustrative embodiment of the present invention. In each case the input to the quantizer/coding kernel is given by the series of the spectral coefficients y(b,0) ... y(b,n−1). That is, the DPCM encoding is performed across the frequency domain, as opposed to, for example, predictive coding across the time domain as is performed by conventional subband-ADPCM coders, well known to those skilled in the art.

Specifically, rotating switch 33 of the illustrative encoder of FIG. 3 and rotating switch 43 of the illustrative encoder of FIG. 4, each are used to bring the spectral values y(b,0) ... y(b,n−1) into a serial order prior to quantization/encoding by DPCM encoders 34 and 44, respectively, and rotating switch 35 of the illustrative encoder of FIG. 3 and rotating switch 46 of the illustrative encoder of FIG. 4 each are used to bring the respective resulting index values i(b,0) ... i(b,n−1) into a parallel order thereafter. Although in each of the illustrative encoders shown, the processing of the spectral values y(b,0) ... y(b,n−1) is advantageously performed in order of increasing frequency, other illustrative embodiments may perform the processing either in order of decreasing frequency or in other alternative (e.g., non-monotonic) orderings. Moreover, only a subset of the spectral values (rather than all "n" of them, as shown herein) may be provided to DPCM encoders 34 and 44 for differential coding.

More specifically, FIG. 3 shows a first illustrative embodiment of an encoder according to the present invention in which a closed-loop prediction scheme is used. Closed-loop prediction is a conventional technique well known to those of ordinary skill in the art. In the illustrative perceptual audio encoder of FIG. 3, however, a closed-loop prediction is applied to the spectral values (i.e., in the frequency domain). In particular, a prediction filter (shown in the figure as comprising predictor 36 and adder 39) is driven by the quantized output values generated by quantizer 37, and the predicted value is subtracted from the input signal by subtractor 38 so that only the prediction error signal is advantageously quantized/encoded. Note that quantizer 37 performs quantizations $Q_0 \ldots Q_{n-1}$, respectively, for each of the spectral component values y(b,0) ... y(b,n−1) which are provided thereto by rotating switch 33 (via subtractor 38). The use of the illustrative encoder of FIG. 3 will advantageously result in a coding gain if the encoder input signal x(k) has a transient characteristic.

FIG. 4 shows a second illustrative embodiment of an encoder according to the present invention in which an open-loop prediction scheme is used. Open-loop prediction is a conventional technique well known to those of ordinary skill in the art. In the illustrative perceptual audio encoder of FIG. 4, however, an open-loop prediction is applied to the spectral values (i.e., in the frequency domain). In particular, predictor 47 is driven by the unquantized input values and the predicted value is then subtracted from the input signal by subtractor 48 so that only the prediction error signal is advantageously quantized/encoded (by quantizer 45). Note that quantizer 45 performs quantizations $Q_0 \ldots Q_{n-1}$, respectively, for each of the spectral component values y(b,0) ... y(b,n−1) for which corresponding prediction error signals are provided thereto by rotating switch 43 (via subtractor 48).

Like the illustrative encoder of FIG. 3, the use of the illustrative encoder of FIG. 4 will also advantageously result in a coding gain if the encoder input signal x(k) has transient characteristics. In addition, however, the use of a perceptual audio encoder employing the open-loop approach of FIG. 4 will advantageously produce a timeshaped quantization error in the final reconstructed output signal x'(k) of a corresponding decoder. This follows from the fact that open-loop prediction has been applied to spectral coefficients so that the quantization noise appears as shaped in time, thereby putting the noise level under the signal level. In this way, temporal problems with unmasking, either in transient or in pitchy signals, are advantageously avoided without the need for substantial overcoding and its commensurate expenditure of bits.

Since in the above-described illustrative embodiments of the present invention predictive coding is applied to spectral domain data, certain relations known for classic prediction are valid with time and frequency domain swapped. For example, prediction gain is achieved depending on the "envelope flatness measure" of the signal (as opposed to the "spectral flatness measure"). Moreover, in the open-loop case shown in FIG. 4, the prediction error is shaped in time (as opposed to frequency). In effect, therefore, the above-described open-loop technique may, for example, be considered equivalent to applying an adaptive time domain window by prediction in the frequency domain, effectively using convolution by a few elements in the frequency domain to instantiate time-domain noise shaping.

Although in the above-described embodiments the prediction process is performed over the entire frequency spectrum (i.e., for all spectral coefficients), in other illustrative embodiments the prediction may be performed for only a portion of the spectrum (i.e., for a subset of the spectral coefficients). In addition, different predictor filters can be advantageously employed in different portions of the signal spectrum. In this manner, the instant inventive method for time-domain noise control can be applied in any desired frequency-dependent fashion.

In order to provide for the proper decoding of the encoded signal, the bitstream generated by the illustrative encoders of FIGS. 3 and 4 advantageously includes certain additional side information, shown, for example, as an additional input to bitstream encoder 18 of FIG. 1. In various illustrative embodiments of the present invention, for example, one field of side information may indicate the use of DPCM encoding and the number of different prediction filters used. Then, additional fields in the bitstream may be transmitted for each prediction filter signalling the target frequency range of the respective filter and its filter coefficients.

Figure 6:
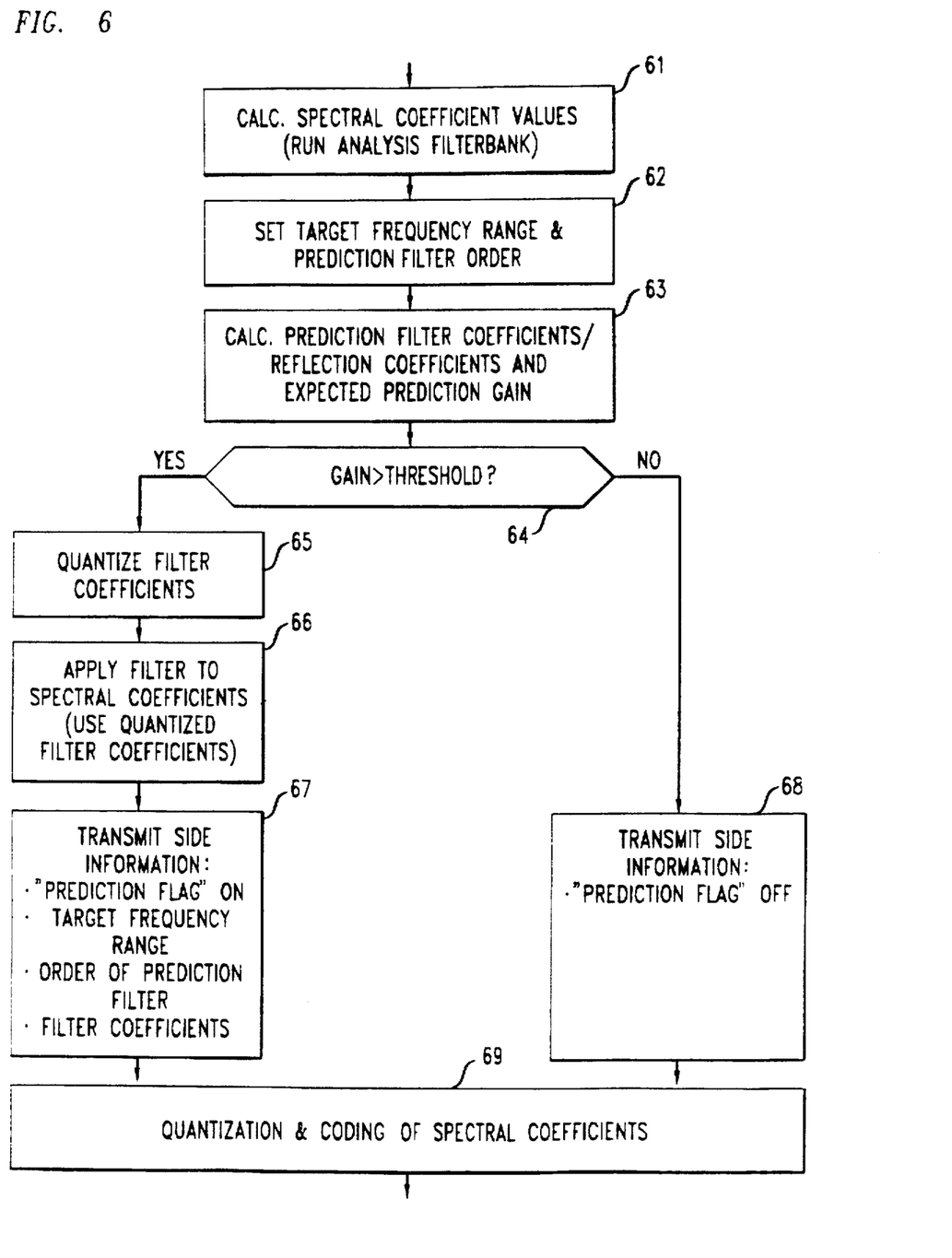
FIG. 6 shows a flowchart of a method of encoding audio signals in accordance with an illustrative embodiment of the present invention.

FIG. 6 shows a flow chart of a method of encoding monophonic audio signals in accordance with an illustrative embodiment of the present invention. The illustrative example shown in this flow chart implements certain relevant portions of a perceptual audio encoder with open-loop prediction and a single prediction filter. Specifically, step 61 performs a conventional calculation of the spectral values by an analysis filterbank (as performed, for example, by analysis filterbank/transform 12 of the conventional encoder of FIG. 1). Then, the order of the prediction filter is set and the target frequency range is defined in step 62. These parameters may, for example, be illustratively set to a filter order of 15 and a target frequency range of from 4 kHz to 20 kHz. With these illustrative parameter values, pre-echoes and post-echoes will be advantageously removed when coding pitchy signals.

In step 63, the prediction filter is determined by using the range of spectral coefficients matching the target frequency range and applying a conventional method for predictive coding as is well known for DPCM coders. For example, the autocorrelation function of the coefficients may be calculated and used in a conventional Levinson-Durbin recursion algorithm, well known to those skilled in the art. As a result, the predictor filter coefficients, the corresponding reflection coefficients ("PARCOR" coefficients) and the expected prediction gain are known.

If the expected prediction gain exceeds a certain threshold (e.g., 2 dB), as determined by decision 64, the DPCM coding procedure of steps 65 through 67 is used. In this case, the prediction filter coefficients are quantized (in step 65) as required for transmission to the decoder as part of the side information. Then, (in step 66) the prediction filter is applied to the range of spectral coefficients matching the target frequency range where the quantized filter coefficients are used. For all further processing the given range of spectral coefficients is replaced by the output of the filtering process. Finally (in step 67), a field of the bitstream is transmitted signalling the use of DPCM coding ("prediction flag" on), and the target frequency range, the order of the prediction filter and information describing its filter coefficients are also included in the bitstream. If, on the other hand, the expected prediction gain does not exceed the decision threshold, step 68 transmits a field in the bitstream signalling that no DPCM coding has been used ("prediction flag" off). Finally, in either case, the quantization process is applied to the spectral coefficients (step 69), where the quantization is based on the perceptual masking thresholds generated by the perceptual model of the encoder.

Using an open-loop encoder embodiment of the present invention (e.g., as shown in the illustrative apparatus of FIG. 3 and in the illustrative method of FIG. 6), a straightforward temporal noise shaping effect can be achieved for certain conventional block transforms including the Discrete Fourier Transform (DFT) or the Discrete Cosine Transform (DCT), both well-known to those of ordinary skill in the art. If, for example, a perceptual coder in accordance with the present invention uses a critically subsampled filterbank with overlapping windows—e.g., a conventional Modified Discrete Cosine Transform (MDCT) or another conventional filterbank based on Time Domain Aliasing Cancellation (TDAC)—the resultant temporal noise shaping is subject to the time domain aliasing effects inherent in the filterbank. For example, in the case of a MDCT, one mirroring (i.e., aliasing) operation per window half takes place and the quantization noise appears mirrored (i.e., aliased) within the left and the right half of the window after decoding, respectively. Since the final filterbank output is obtained by applying a synthesis window to the output of each inverse transform and performing an overlap-add of these data segments, the undesired aliased components are attenuated depending on the used synthesis window. Thus it is advantageous to choose a filterbank window that exhibits only a small overlap between subsequent blocks so that the temporal aliasing effect is minimized. An appropriate strategy in the encoder can, for example, adaptively select a window with a low degree of overlap for critical signals of very transient character while using a wider window type for stationary signals providing a better frequency selectivity. The implementation details of such a strategy will be obvious to those skilled in the art.

Figure 2:
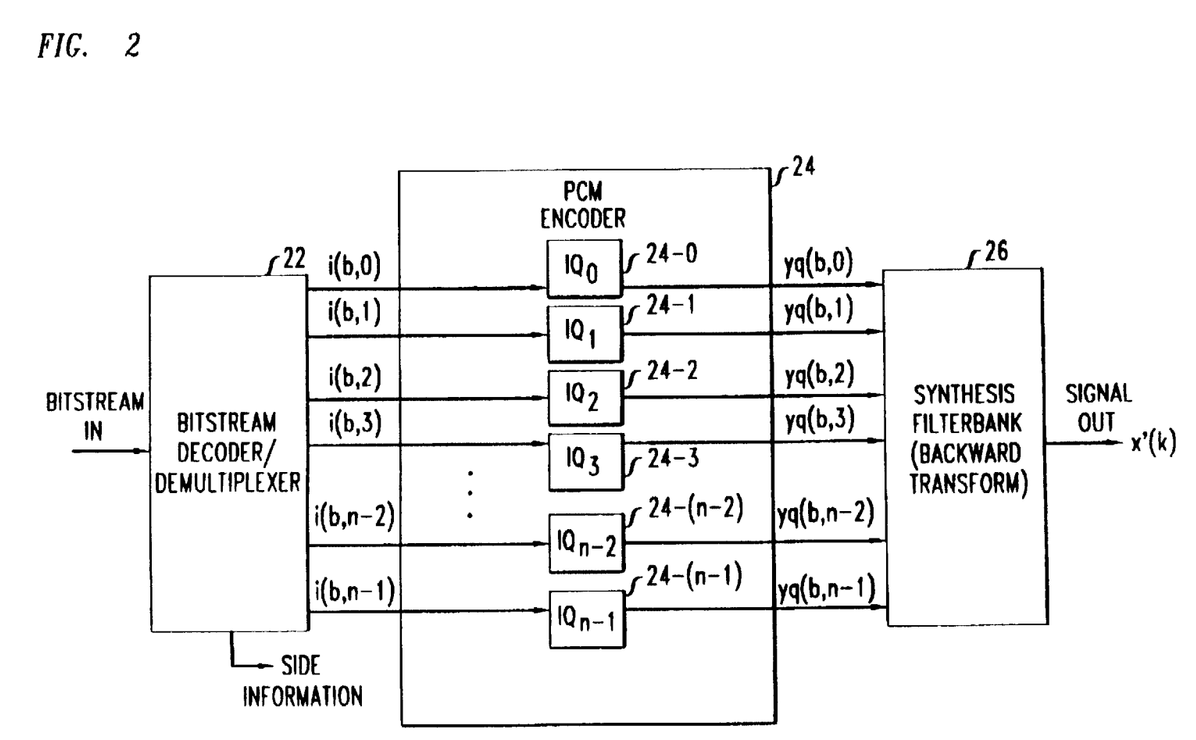
FIG. 2 shows a conventional apparatus for performing perceptual audio decoding corresponding to the perceptual audio encoding apparatus of FIG. 1.

FIG. 2 shows a conventional perceptual decoder for use in decoding monophonic audio signals corresponding to the conventional perceptual encoder of FIG. 1. The decoder of FIG. 2 performs the following steps:

The incoming bitstream is parsed and the index values i(b,0) . . . i(b,n−1) are extracted by decoder/demultiplexer 22.

Using inverse quantizers 24-0 through 24-(n−1) (performing inverse quantizations $IQ_0$ . . . $IQ_{n-1}$, respectively), the quantized spectral values yq(b,1) . . . yq(b,n−1) are reconstructed by PCM decoder 24.

The quantized spectral values yq(b,1) . . . yq(b,n−1) are mapped back to a time domain representation by synthesis filterbank 26, resulting in reconstructed output signal x'(k).

Figure 5:
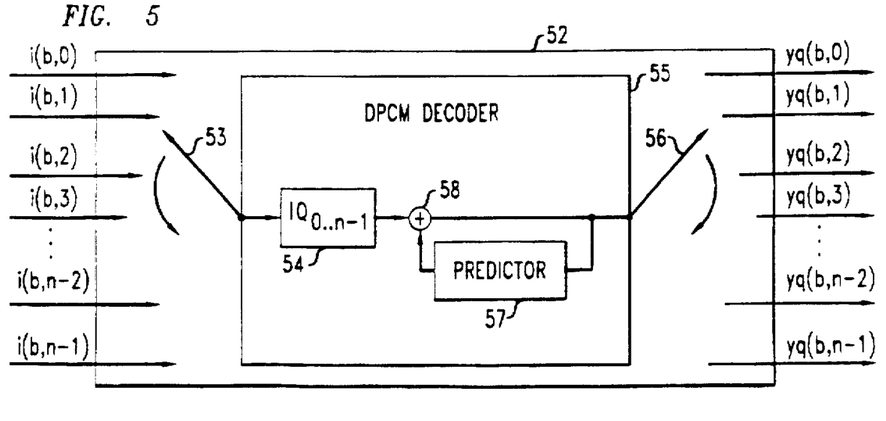
FIG. 5 shows a perceptual audio decoder in accordance with an illustrative embodiment of the present invention.

In accordance with an illustrative embodiment of the present invention, the conventional decoding apparatus of FIG. 2 may be advantageously modified by replacing PCM decoder 24 with a DPCM-type decoder wherein the DPCM decoding is performed in the frequency domain. FIG. 5 shows one such illustrative embodiment of the present invention. In particular, an illustrative embodiment of the present invention may be realized by replacing PCM decoder 24 of the conventional decoding apparatus of FIG. 2 with module 52 as shown in FIG. 5, thereby resulting in an decoding apparatus in accordance with an illustrative embodiment of the present invention. Specifically, the input to DPCM decoder 55 is given by the series of index values i(b,0) . . . i(b,n−1), which are brought into a serial order prior to decoding by rotating switch 53. The resulting spectral values yq(b,0) . . . yq(b,n−1) are brought into a parallel order after the DPCM decoding by rotating switch 56.

DPCM decoder 55 comprises inverse quantizer 54, predictor 57 and adder 58. Inverse quantizer 54 performs inverse quantizations $IQ_0$ . . . $IQ_{n-1}$, respectively, for each of the index values i(b,0) . . . i(b,n−1) which are provided thereto by rotating switch 53. Note that, if the illustrative open-loop encoder of FIG. 4 has been used to encode the audio signal, the combination of predictor 57 and adder 58 of the illustrative decoder of FIG. 5 effectuate a noise shaping filter which advantageously controls the temporal shape of the quantization noise. Again, although the illustrative decoder of FIG. 5 advantageously performs the processing of the index values i(b,0) . . . i(b,n−1) in order of increasing frequency, other illustrative embodiments may perform the processing either in order of decreasing frequency or in other alternative (e.g., non-monotonic) orderings, preferably in a consistent manner to the ordering employed by a corresponding encoder. Moreover, only a subset of the index values (rather than all "n" of them, as shown herein) may be provided to DPCM decoder 55, and/or several different predictor filters may be used for different portions of the signal spectrum, again preferably in a consistent manner with the specific technique employed by a corresponding encoder. Note also that, in the latter case, for example, in order to execute a proper decoding of the incoming bitstream, a decoder in accordance with the present invention may advantageously evaluate additional side information which has been transmitted by a corresponding encoder. In this manner, the decoder may apply DPCM decoding in each specified target frequency range with a desired corresponding decoder prediction filter.

Figure 7:
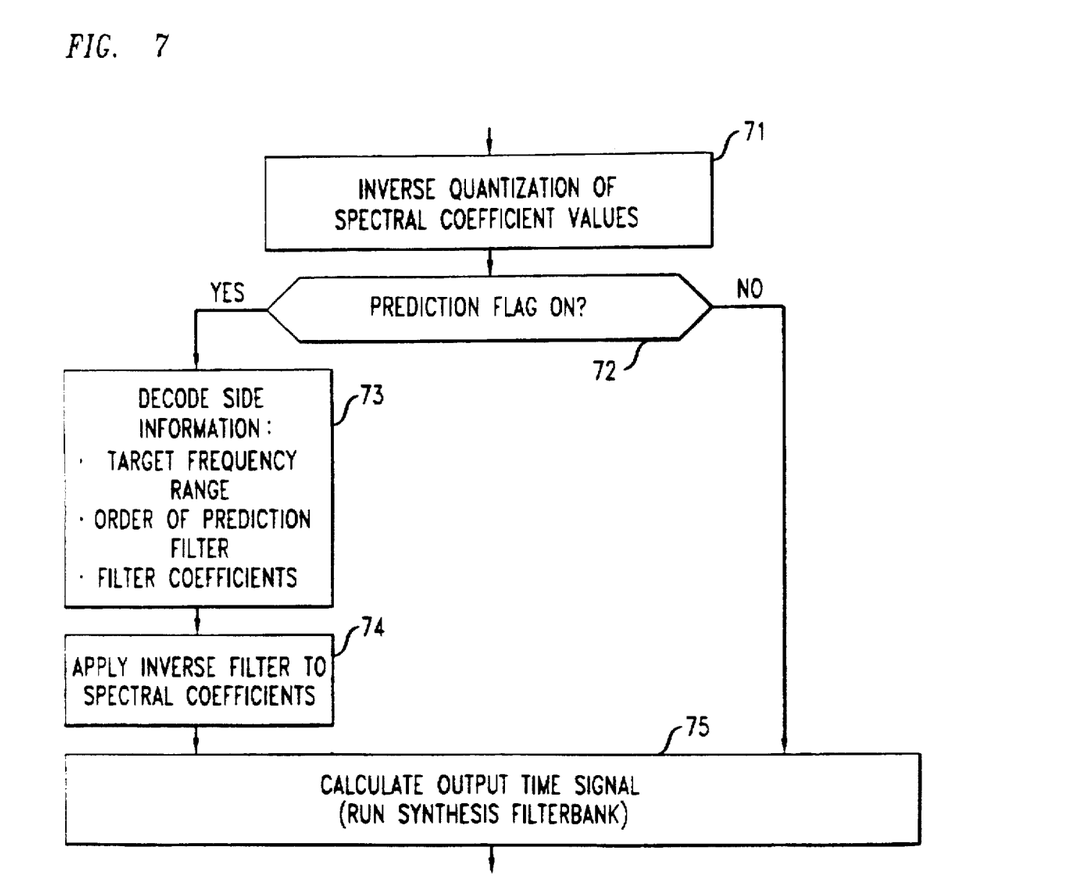
FIG. 7 shows a flowchart of a method of decoding coded audio signals in accordance with an illustrative embodiment of the present invention.

FIG. 7 shows a flow chart of a method of decoding monophonic audio signals in accordance with an illustrative embodiment of the present invention. The illustrative example shown in this flow chart implements certain relevant portions of a perceptual audio decoder with a single prediction filter. Specifically, step 71 performs a conventional reconstruction of the spectral coefficient values by inverse quantization. Then, decision 72 checks the bitstream information to determine if the use of DPCM coding is indicated ("prediction flag" is on). If it is, then the extended decoding process shown in steps 73 and 74 is applied. Specifically, the transmitted side information in the bitstream is decoded to determine the target frequency range of the DPCM coding, the order of the prediction filter, and information describing its filter coefficients (step 73). Then, the inverse prediction filter is applied to the range of spectral coefficients matching the specified target frequency range (step 74). For all further processing, the given range of spectral coefficients is replaced by the output of the filtering process. Finally (and regardless of the determination made by decision 72 described above), a conventional synthesis filterbank is run from the spectral coefficients in step 75.

Although a number of specific embodiments of this invention have been shown and described herein, it is to be understood that these embodiments are merely illustrative of the many possible specific arrangements which can be devised in application of the principles of the invention. For example, although the illustrative embodiments which have been shown and described herein have been limited to the encoding and decoding of monophonic audio signals, alternative embodiments which may be used for the encoding and decoding of multichannel (e.g., stereophonic) audio signals will be obvious to those of ordinary skill in the art based on the disclosure provided herein. In addition, numerous and varied other arrangements can be devised in accordance with these principles by those of ordinary skill in the art without departing from the spirit and scope of the invention.

I claim:

1. A method of encoding an audio signal to generate an encoded signal, the encoding based on a perceptual model, the method comprising the steps of:

(a) performing a spectral decomposition of the audio signal into a plurality of spectral component signals;

(b) generating a prediction signal representative of a prediction of one of said spectral component signals, said prediction based on one or more other ones of said spectral component signals;

(c) comparing the prediction signal with said one of said spectral component signals to generate a prediction error signal;

(d) coding said one of said spectral component signals to generate a coded spectral component signal, said coding based on the prediction error signal and further based on the perceptual model; and (e) generating the encoded signal based on the coded spectral component signal.

2. The method of claim 1 wherein the audio signal comprises speech.

3. The method of claim 1 wherein the audio signal comprises music.

4. The method of claim 1 wherein the step of coding said one of said spectral component signals comprises quantizing the prediction error signal.

5. The method of claim 1 wherein the generation of the prediction signal and the coding of said one of said spectral component signals are performed in a closed-loop fashion.

6. The method of claim 1 wherein the generation of the prediction signal and the coding of said one of said spectral component signals are performed in a open-loop fashion.

7. A method of decoding an encoded audio signal to generate a reconstructed audio signal, the encoded signal comprising a plurality of coded spectral component signals having been encoded based on a perceptual model, the method comprising the steps of:

(a) decoding a first one of said coded spectral component signals;

(b) generating a prediction signal representative of a prediction of a second one of said spectral component signals, said prediction based on the decoding of the first one of said coded spectral component signals;

(c) decoding the second one of said spectral component signals based on the prediction signal; and (d) generating the reconstructed audio signal based on the decoding of the first one of said coded spectral component signals and on the decoding of the second one of said coded spectral component signals.

8. The method of claim 7 wherein the reconstructed audio signal comprises speech.

9. The method of claim 7 wherein the reconstructed audio signal comprises music.

10. The method of claim 7 wherein the step of decoding the first one of said spectral component signals comprises performing an inverse quantization thereof.

11. An encoder for generating an encoded signal from an audio signal, the encoding based on a perceptual model, the encoder comprising:

(a) means for decomposing the audio signal into a plurality of spectral component signals;

(b) means for generating a prediction signal representative of a prediction of one of said spectral component signals, said prediction based on one or more other ones of said spectral component signals;

(c) means for comparing the prediction signal with said one of said spectral component signals to generate a prediction error signal;

(d) a coder for generating a coded spectral component signal representative of said one of said spectral component signals, said coded spectral component signal generated based on the prediction error signal and further based on the perceptual model; and (e) means for generating the encoded signal based on the coded spectral component signal.

12. The encoder of claim 11 wherein the coder comprises a quantizer applied to the prediction error signal.

13. The encoder of claim 11 wherein the means for generating the prediction signal and the coder are arranged in a closed-loop fashion.

14. The encoder of claim 11 wherein the means for generating the prediction signal and the coder are arranged in an open-loop fashion.

15. A decoder for generating a reconstructed audio signal from an encoded audio signal, the encoded audio signal comprising a plurality of coded spectral component signals having been encoded based on a perceptual model, the decoder comprising:

(a) means for decoding a first one of said coded spectral component signals;

(b) means for generating a prediction signal representative of a prediction of a second one of said spectral component signals, said prediction based on the decoding of the first one of said coded spectral component signals;

(c) means for decoding the second one of said spectral component signals based on the prediction signal; and (d) means for generating the reconstructed audio signal based on the decoding of the first one of said coded spectral component signals and on the decoding of the second one of said coded spectral component signals.

16. The decoder of claim 15 wherein the means for decoding the first one of said spectral component signals comprises an inverse quantizer applied thereto.

17. A storage medium having an encoded audio signal recorded thereon, the encoded audio signal having been generated from an audio signal by an encoding method based on a perceptual model and comprising the steps of:

(a) performing a spectral decomposition of the audio signal into a plurality of spectral component signals;

(b) generating a prediction signal representative of a prediction of one of said spectral component signals, said prediction based on one or more other ones of said spectral component signals;

(c) comparing the prediction signal with said one of said spectral component signals to generate a prediction error signal;

(d) coding said one of said spectral component signals to generate a coded spectral component signal, said coding based on the prediction error signal and further based on the perceptual model; and (e) generating the encoded audio signal based on the coded spectral component signal.

18. The storage medium of claim 17 wherein the encoded audio signal comprises speech.

19. The storage medium of claim 17 wherein the encoded audio signal comprises music.

20. The storage medium of claim 17 wherein the step of coding said one of said spectral component signals comprises quantizing the prediction error signal.

21. The storage medium of claim 17 wherein the generation of the prediction signal and the coding of said one of said spectral component signals have been performed in a closed-loop fashion.

22. The storage medium of claim 17 wherein the generation of the prediction signal and the coding of said one of said spectral component signals have been performed in an open-loop fashion.

23. The storage medium of claim 17 wherein the storage medium comprises a compact disc.

24. The storage medium of claim 17 wherein the storage medium comprises a digital audio tape.

\* \* \* \* \*